United States Patent
Elshafie et al.

(10) Patent No.: US 11,553,543 B2
(45) Date of Patent: Jan. 10, 2023

(54) LINK COMBINING AND COMPONENT CARRIER SELECTION ACROSS SIDELINK AND ACCESS LINK INTERFACES

(71) Applicant: QUALCOMM Incorporated, San Diego, CA (US)

(72) Inventors: Ahmed Elshafie, San Diego, CA (US); Seyedkianoush Hosseini, San Diego, CA (US); Yi Huang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 163 days.

(21) Appl. No.: 17/166,765

(22) Filed: Feb. 3, 2021

(65) Prior Publication Data
US 2022/0248480 A1     Aug. 4, 2022

(51) Int. Cl.
*H04W 76/14* (2018.01)
*H03M 13/09* (2006.01)
(Continued)

(52) U.S. Cl.
CPC .......... *H04W 76/14* (2018.02); *H03M 13/09* (2013.01); *H04W 72/042* (2013.01); *H04W 88/04* (2013.01); *H04W 92/18* (2013.01)

(58) Field of Classification Search
CPC .......... G06F 11/08; H03M 13/09–098; H04B 7/024; H04B 7/026; H04B 7/15;
(Continued)

(56) References Cited

U.S. PATENT DOCUMENTS

2018/0054755 A1* 2/2018 Lee .............. H04W 84/04
2018/0324848 A1* 11/2018 Baghel ............ H04W 8/005
(Continued)

FOREIGN PATENT DOCUMENTS

KR    20170020145 A  *  2/2017
WO    WO-2010034349 A1    4/2010
(Continued)

OTHER PUBLICATIONS

Ericsson: "On the Concurrent Operation at the Relay UE", 3GPP Draft, R1-154440, 3GPP TSG-RAN WG1 Meeting #82, 3rd Generation Partnership Project (3GPP), Mobile Competence Centre, 650, Route Des Lucioles, F-06921 Sophia-Antipolis Cedex, France, vol. RAN WG1, No. Beijing, P.R. China, Aug. 24, 2015-Aug. 28, 2015, Aug. 23, 2015 (Aug. 23, 2015), XP051001730, 2 Pages, Retrieved from the Internet: URL:http://www.3gpp.org/ftp/Meetings_3GPP_SYNC/RAN1/Docs/ [retrieved on Aug. 23, 2015] the whole document.
(Continued)

*Primary Examiner* — Thomas R Cairns
(74) *Attorney, Agent, or Firm* — Harrity & Harrity, LLP

(57) ABSTRACT

Various aspects of the present disclosure generally relate to wireless communication. In some aspects, a relay user equipment (UE) may detect, on a sidelink, a sidelink transmission that carries a transport block (TB) to be forwarded to a base station. The relay UE may detect, on an access link, an uplink transmission that carries the TB. The relay UE may generate a message that includes the TB to be forwarded to the base station, wherein the message includes data associated with the TB that is obtained from one or more of the sidelink transmission or the uplink transmission. The relay UE may transmit the message to the base station via the access link. Numerous other aspects are described.

30 Claims, 9 Drawing Sheets

700 ⟶

740
Combine or select between CCs associated with PC5 and Uu links to generate uplink message 710
PC5 transmission carrying TB to be relayed to base station Relay UE 730
Signaling indicating transmission parameters per CC per link Base station 720
Uu transmission carrying TB 750
Uplink message including TB carried in PC5 and/or Uu transmission

(51) Int. Cl.
*H04W 72/04* (2009.01)
*H04W 88/04* (2009.01)
*H04W 92/18* (2009.01)

(58) Field of Classification Search
CPC . H04B 7/15592; H04L 1/1822; H04L 1/1896; H04L 2001/0097; H04L 69/14; H04W 8/005; H04W 16/26; H04W 72/042; H04W 76/14–16; H04W 84/047; H04W 84/18; H04W 88/04; H04W 92/18
See application file for complete search history.

(56) References Cited

U.S. PATENT DOCUMENTS

2019/0098697 A1* 3/2019 Fujishiro ............... H04W 40/12
2022/0109970 A1* 4/2022 Jeong .................. H04W 72/02

FOREIGN PATENT DOCUMENTS

| WO | WO-2017039735 A1 | | 3/2017 |
| WO | WO-2018059126 A1 | * | 4/2018 |
| WO | WO-2022110234 A1 | * | 6/2022 |

OTHER PUBLICATIONS

International Search Report and Written Opinion—PCT/US2021/072566—ISA/EPO—dated Mar. 22, 2022.

* cited by examiner

LINK COMBINING AND COMPONENT CARRIER SELECTION ACROSS SIDELINK AND ACCESS LINK INTERFACES

FIELD OF THE DISCLOSURE

Aspects of the present disclosure generally relate to wireless communication and to techniques and apparatuses for link combining and component carrier selection across sidelink and access link interfaces.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include a number of base stations (BSs) that can support communication for a number of user equipment (UEs). A UE may communicate with a BS via the downlink and uplink. The downlink (or forward link) refers to the communication link from the BS to the UE, and the uplink (or reverse link) refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, or the like.

The above multiple access technologies have been adopted in various telecommunication standards to provide a common protocol that enables different user equipment to communicate on a municipal, national, regional, and even global level. NR, which may also be referred to as 5G, is a set of enhancements to the LTE mobile standard promulgated by the 3GPP. NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

In some aspects, a method of wireless communication performed by a relay user equipment (UE) includes detecting, on a sidelink, a sidelink transmission that carries a transport block (TB) to be forwarded to a base station; detecting, on an access link, an uplink transmission that carries the TB; generating a message that includes the TB to be forwarded to the base station, wherein the message includes data associated with the TB that is obtained from one or more of the sidelink transmission or the uplink transmission; and transmitting the message to the base station via the access link.

In some aspects, a relay UE for wireless communication includes a memory and one or more processors operatively coupled to the memory, the memory and the one or more processors configured to: detect, on a sidelink, a sidelink transmission that carries a TB to be forwarded to a base station; detect, on an access link, an uplink transmission that carries the TB; generate a message that includes the TB to be forwarded to the base station, wherein the message includes data associated with the TB that is obtained from one or more of the sidelink transmission or the uplink transmission; and transmit the message to the base station via the access link.

In some aspects, a non-transitory computer-readable medium storing a set of instructions for wireless communication includes one or more instructions that, when executed by one or more processors of a relay UE, cause the relay UE to: detect, on a sidelink, a sidelink transmission that carries a TB to be forwarded to a base station; detect, on an access link, an uplink transmission that carries the TB; generate a message that includes the TB to be forwarded to the base station, wherein the message includes data associated with the TB that is obtained from one or more of the sidelink transmission or the uplink transmission; and transmit the message to the base station via the access link.

In some aspects, an apparatus for wireless communication includes means for detecting, on a sidelink, a sidelink transmission that carries a TB to be forwarded to a base station; means for detecting, on an access link, an uplink transmission that carries the TB; means for generating a message that includes the TB to be forwarded to the base station, wherein the message includes data associated with the TB that is obtained from one or more of the sidelink transmission or the uplink transmission; and means for transmitting the message to the base station via the access link.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with a 5G or NR radio access technology (RAT), aspects of the present disclosure can be applied to other RATs, such as a 3G RAT, a 4G RAT, and/or a RAT subsequent to 5G (e.g., 6G).

Figure 1:
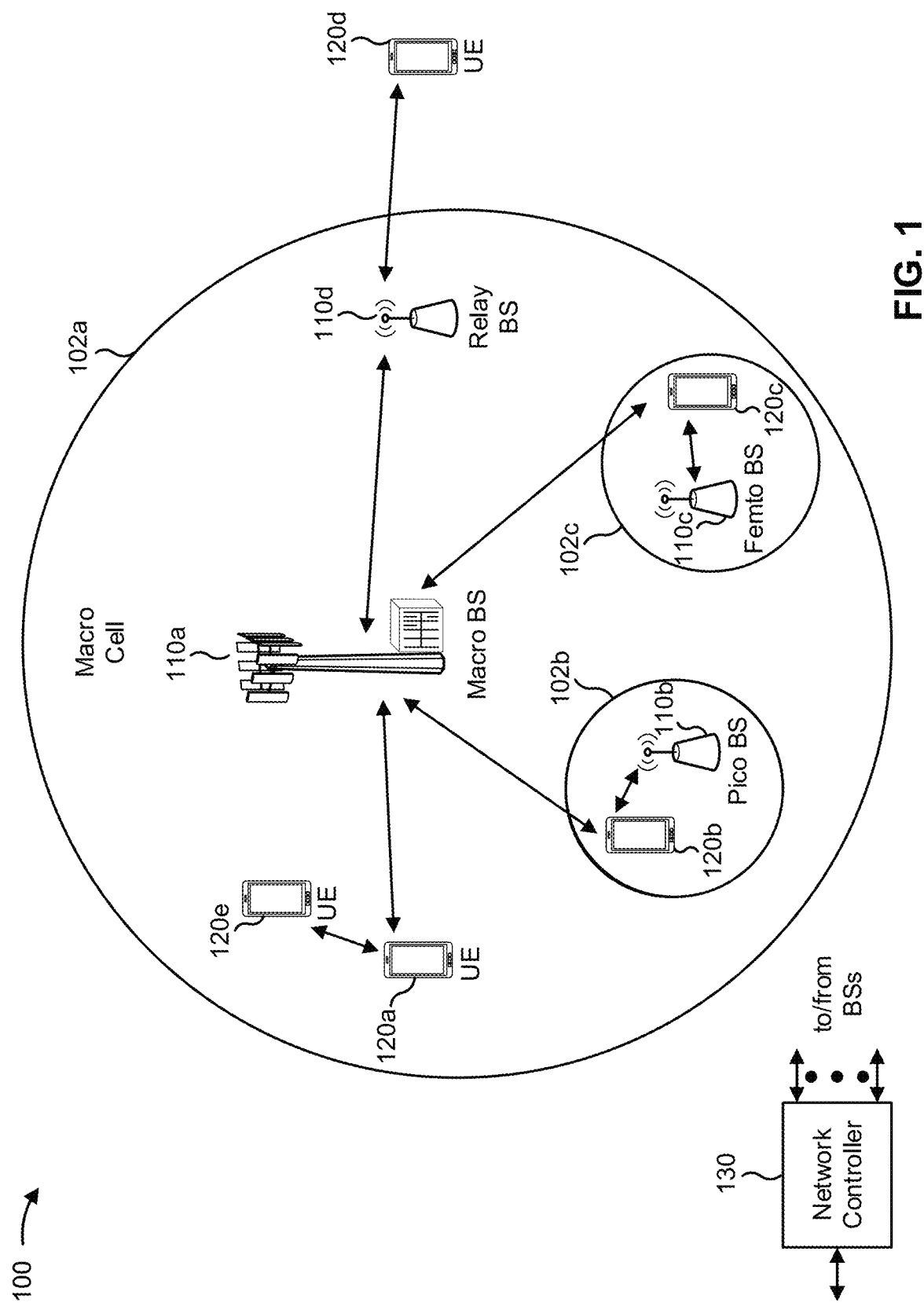
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (NR) network and/or an LTE network, among other examples. The wireless network 100 may include a number of base stations 110 (shown as BS 110a, BS 110b, BS 110c, and BS 110d) and other network entities. A base station (BS) is an entity that communicates with user equipment (UEs) and may also be referred to as an NR BS, a Node B, a gNB, a 5G node B (NB), an access point, a transmit receive point (TRP), or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces, such as a direct physical connection or a virtual network, using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay BS 110d may communicate with macro BS 110a and a UE 120d in order to facilitate communication between BS 110a and UE 120d. A relay BS may also be referred to as a relay station, a relay base station, a relay, or the like.

Wireless network 100 may be a heterogeneous network that includes BSs of different types, such as macro BSs, pico BSs, femto BSs, relay BSs, or the like. These different types of BSs may have different transmit power levels, different coverage areas, and different impacts on interference in wireless network 100. For example, macro BSs may have a high transmit power level (e.g., 5 to 40 watts) whereas pico BSs, femto BSs, and relay BSs may have lower transmit power levels (e.g., 0.1 to 2 watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, and/or location tags, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components and/or memory components. In some aspects, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks may be deployed in a given geographic area. Each wireless network may support a particular RAT and may operate on one or more frequencies. A RAT may also be referred to as a radio technology, an air interface, or the like. A frequency may also be referred to as a carrier, a frequency channel, or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol or a vehicle-to-infrastructure (V2I) protocol), and/or a mesh network. In this case, the UE 120 may perform scheduling operations, resource selection operations, and/or other operations described elsewhere herein as being performed by the base station 110.

Devices of wireless network 100 may communicate using the electromagnetic spectrum, which may be subdivided based on frequency or wavelength into various classes, bands, channels, or the like. For example, devices of wireless network 100 may communicate using an operating band having a first frequency range (FR1), which may span from 410 MHz to 7.125 GHz, and/or may communicate using an operating band having a second frequency range (FR2), which may span from 24.25 GHz to 52.6 GHz. The frequencies between FR1 and FR2 are sometimes referred to as mid-band frequencies. Although a portion of FR1 is greater than 6 GHz, FR1 is often referred to as a "sub-6 GHz" band. Similarly, FR2 is often referred to as a "millimeter wave" band despite being different from the extremely high frequency (EHF) band (30 GHz-300 GHz) which is identified by the International Telecommunications Union (ITU) as a "millimeter wave" band. Thus, unless specifically stated otherwise, it should be understood that the term "sub-6 GHz" or the like, if used herein, may broadly represent frequencies less than 6 GHz, frequencies within FR1, and/or mid-band frequencies (e.g., greater than 7.125 GHz). Similarly, unless specifically stated otherwise, it should be understood that the term "millimeter wave" or the like, if used herein, may broadly represent frequencies within the EHF band, frequencies within FR2, and/or mid-band frequencies (e.g., less than 24.25 GHz). It is contemplated that the frequencies included in FR1 and FR2 may be modified, and techniques described herein are applicable to those modified frequency ranges.

As indicated above, FIG. 1 is provided as an example. Other examples may differ from what is described with regard to FIG. 1.

Figure 2:
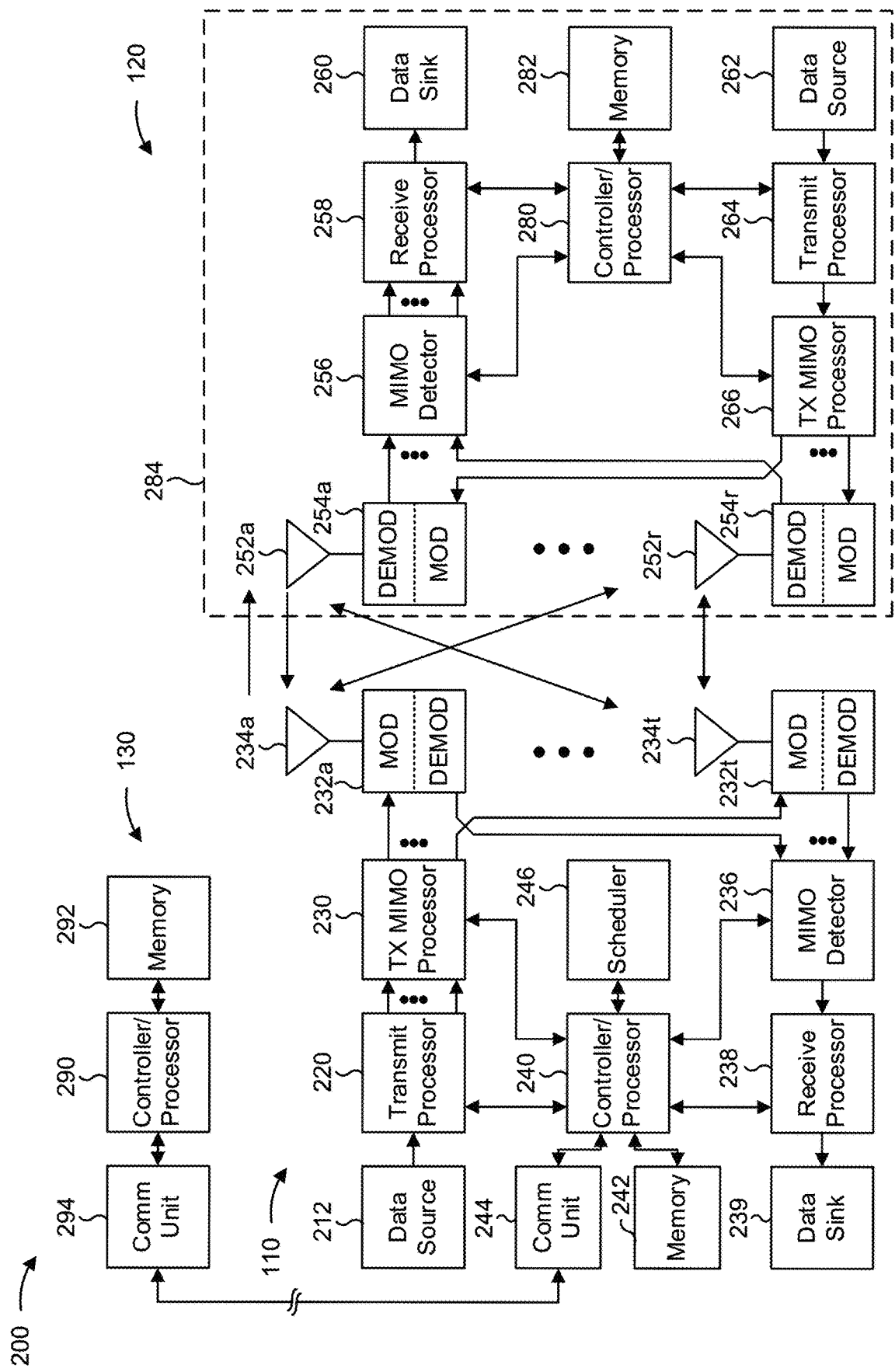
FIG. 2 is a diagram illustrating an example of a base station in communication with a UE in a wireless network, in accordance with the present disclosure.

FIG. 2 is a diagram illustrating an example 200 of a base station 110 in communication with a UE 120 in a wireless network 100, in accordance with the present disclosure. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI)) and control information (e.g., CQI requests, grants, and/or upper layer signaling) and provide overhead symbols and control symbols. Transmit processor 220 may also generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a channel quality indicator (CQI) parameter, among other examples. In some aspects, one or more components of UE 120 may be included in a housing 284.

Network controller 130 may include communication unit 294, controller/processor 290, and memory 292. Network controller 130 may include, for example, one or more devices in a core network. Network controller 130 may communicate with base station 110 via communication unit 294.

Antennas (e.g., antennas 234a through 234t and/or antennas 252a through 252r) may include, or may be included within, one or more antenna panels, antenna groups, sets of antenna elements, and/or antenna arrays, among other examples. An antenna panel, an antenna group, a set of antenna elements, and/or an antenna array may include one or more antenna elements. An antenna panel, an antenna group, a set of antenna elements, and/or an antenna array may include a set of coplanar antenna elements and/or a set of non-coplanar antenna elements. An antenna panel, an antenna group, a set of antenna elements, and/or an antenna array may include antenna elements within a single housing and/or antenna elements within multiple housings. An antenna panel, an antenna group, a set of antenna elements, and/or an antenna array may include one or more antenna elements coupled to one or more transmission and/or reception components, such as one or more components of FIG. 2.

On the uplink, at UE 120, a transmit processor 264 may receive and process data from a data source 262 and control information (e.g., for reports that include RSRP, RSSI, RSRQ, and/or CQI) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM or CP-OFDM), and transmitted to base station 110. In some aspects, a modulator and a demodulator (e.g., MOD/DEMOD 254) of the UE 120 may be included in a modem of the UE 120. In some aspects, the UE 120 includes a transceiver. The transceiver may include any combination of antenna(s) 252, modulators and/or demodulators 254, MIMO detector 256, receive processor 258, transmit processor 264, and/or TX MIMO processor 266. The transceiver may be used by a processor (e.g., controller/processor 280) and memory 282 to perform aspects of any of the methods described herein, for example, as described with reference to FIGS. 7-8.

At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Base station 110 may include a scheduler 246 to schedule UEs 120 for downlink and/or uplink communications. In some aspects, a modulator and a demodulator (e.g., MOD/DEMOD 232) of the base station 110 may be included in a modem of the base station 110. In some aspects, the base station 110 includes a transceiver. The transceiver may include any combination of antenna(s) 234, modulators and/or demodulators 232, MIMO detector 236, receive processor 238, transmit processor 220, and/or TX MIMO processor 230. The transceiver may be used by a processor (e.g., controller/processor 240) and memory 242 to perform aspects of any of the methods described herein, for example, as described with reference to FIGS. 7-8.

Controller/processor 240 of base station 110, controller/processor 280 of UE 120, and/or any other component(s) of FIG. 2 may perform one or more techniques associated with link combining and component carrier selection across sidelink and access link interfaces, as described in more detail elsewhere herein. For example, controller/processor 240 of base station 110, controller/processor 280 of UE 120, and/or any other component(s) of FIG. 2 may perform or direct operations of, for example, process 800 of FIG. 8 and/or other processes as described herein. Memories 242 and 282 may store data and program codes for base station 110 and UE 120, respectively. In some aspects, memory 242 and memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 800 of FIG. 8 and/or other processes as described herein. In some aspects, executing instructions may include running the instructions, converting the instructions, compiling the instructions, and/or interpreting the instructions, among other examples.

In some aspects, the UE 120 includes means for detecting, on a sidelink, a sidelink transmission that carries a transport block (TB) to be forwarded to a base station; means for detecting, on an access link, an uplink transmission that carries the TB; means for generating a message that includes the TB to be forwarded to the base station, wherein the message includes data associated with the TB that is obtained from one or more of the sidelink transmission or the uplink transmission; and/or means for transmitting the message to the base station via the access link. The means for the UE 120 to perform operations described herein may include, for example, one or more of antenna 252, demodulator 254, MIMO detector 256, receive processor 258, transmit processor 264, TX MIMO processor 266, modulator 254, controller/processor 280, or memory 282.

In some aspects, the UE 120 includes means for obtaining data associated with the TB from the sidelink transmission based at least in part on a set of parameters associated with the sidelink transmission; means for obtaining data associated with the TB from the uplink transmission based at least in part on a set of parameters associated with the uplink transmission; and/or means for combining the data obtained from the sidelink transmission and the data obtained from the uplink transmission to generate the message.

In some aspects, the UE 120 includes means for performing a cyclic redundancy check (CRC) for the TB included in the sidelink transmission and the TB included in the uplink transmission; and/or means for determining that the message that includes the TB to be forwarded to the base station has passed the CRC based at least in part on the TB included in the sidelink transmission or the TB included in the uplink transmission passing the CRC.

In some aspects, the UE 120 includes means for identifying a first set of component carriers associated with the sidelink and a second set of component carriers associated with the access link; and/or means for selecting, from the first set of component carriers and the second set of component carriers, one or more component carriers from which to obtain the data associated with the TB to be forwarded to the base station.

In some aspects, the UE 120 includes means for receiving signaling that indicates transmission parameters associated with the sidelink transmission per component carrier associated with the sidelink; and/or means for receiving signaling that indicates transmission parameters associated with the uplink transmission per component carrier associated with the access link.

In some aspects, the UE 120 includes means for receiving, from the base station, a report that indicates one or more best component carriers for the relay UE, wherein the one or more component carriers are selected based at least in part on the one or more best component carriers.

In some aspects, the UE 120 includes means for announcing, via one or more of the sidelink or the access link, the one or more component carriers used to obtain the data associated with the TB.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of controller/processor 280.

As indicated above, FIG. 2 is provided as an example. Other examples may differ from what is described with regard to FIG. 2.

Figure 3:
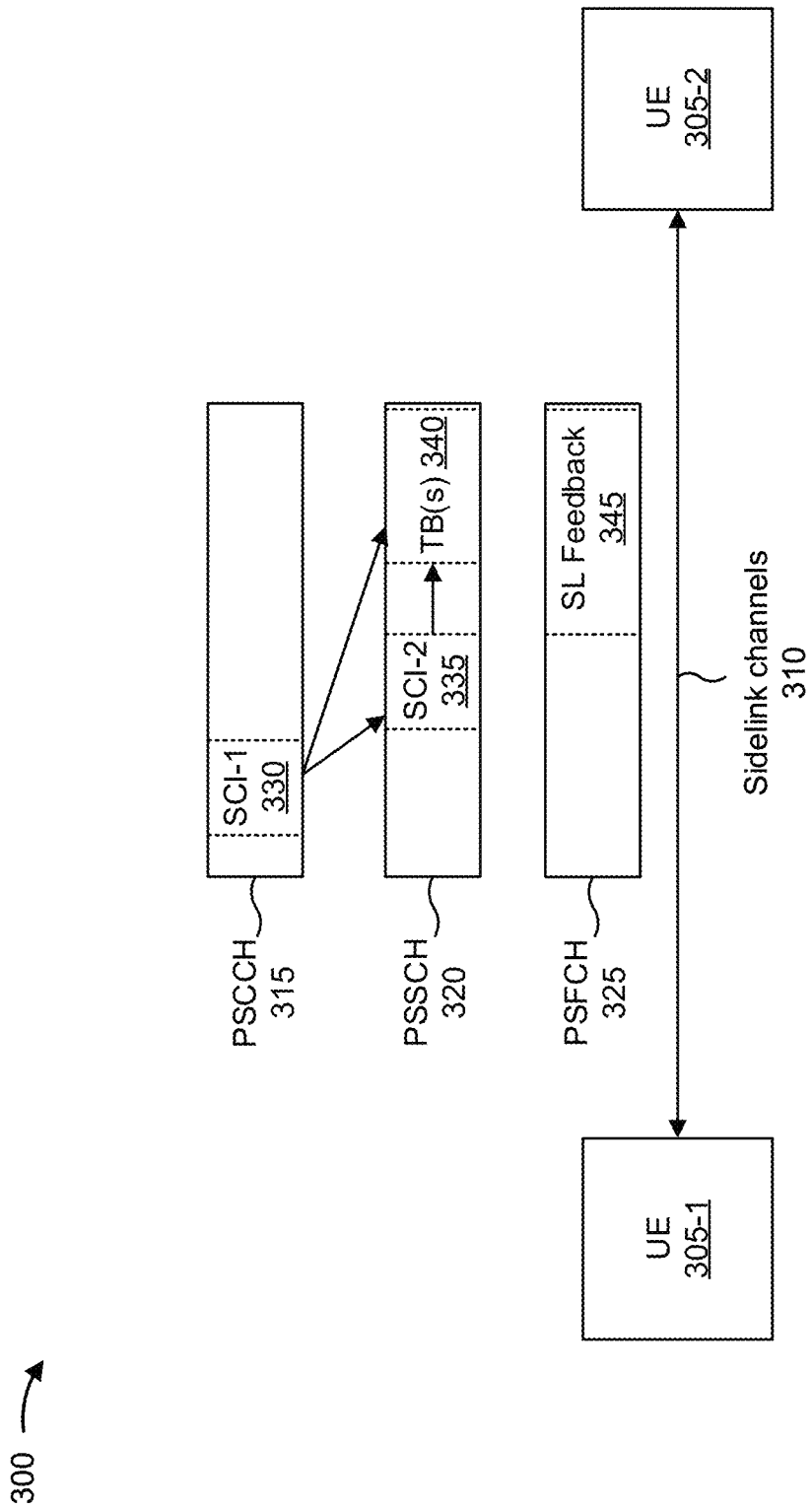
FIG. 3 is a diagram illustrating an example of sidelink communications, in accordance with the present disclosure.

FIG. 3 is a diagram illustrating an example 300 of sidelink communications, in accordance with the present disclosure.

As shown in FIG. 3, a first UE 305-1 may communicate with a second UE 305-2 (and one or more other UEs 305) via one or more sidelink channels 310. The UEs 305-1 and 305-2 may communicate using the one or more sidelink channels 310 for P2P communications, D2D communications, V2X communications (e.g., which may include V2V communications, V2I communications, and/or V2P communications), mesh networking, and/or uplink or downlink relaying to extend network coverage and/or save power (e.g., for a reduced capability UE), among other examples. In some aspects, the UEs 305 (e.g., UE 305-1 and/or UE 305-2) may correspond to one or more other UEs described elsewhere herein, such as UE 120. In some aspects, the one or more sidelink channels 310 may use a PC5 interface and/or may operate in a high frequency band (e.g., the 5.9 GHz band) or an unlicensed or shared frequency band (e.g., an NR unlicensed (NR-U) frequency band). Additionally, or alternatively, the UEs 305 may synchronize timing of transmission time intervals (TTIs) (e.g., frames, subframes, slots, or symbols) using global navigation satellite system (GNSS) timing.

As further shown in FIG. 3, the one or more sidelink channels 310 may include a physical sidelink control channel (PSCCH) 315, a physical sidelink shared channel (PSSCH) 320, and/or a physical sidelink feedback channel (PSFCH) 325. The PSCCH 315 may be used to communicate control information, similar to a physical downlink control channel (PDCCH) and/or a physical uplink control channel (PUCCH) used for cellular communications with a base station 110 via an access link or an access channel. The PSSCH 320 may be used to communicate data, similar to a physical downlink shared channel (PDSCH) and/or a physical uplink shared channel (PUSCH) used for cellular communications with a base station 110 via an access link or an access channel.

For example, in some aspects, the PSCCH 315 may carry sidelink control information (SCI), which may indicate various parameters and/or other control information used for sidelink communications. For example, in some aspects, the SCI may include stage one SCI (SCI-1) 330, which may include an indication of one or more resources (e.g., time resources, frequency resources, and/or spatial resources) where a transport block (TB) 340 that includes data may be carried on the PSSCH 320. Furthermore, in some aspects, the SCI-1 330 may include information for decoding sidelink communications on the PSSCH 320, a priority (e.g., a quality of service (QoS) value), a resource reservation period, a PSSCH DMRS pattern, an SCI format and a beta offset for stage two sidelink control information (SCI-2) 335 transmitted on the PSSCH 320, a quantity of PSSCH DMRS ports, and/or a MCS, among other examples.

In some aspects, the information carried on the PSSCH 320 may include the SCI-2 335 and/or the TB 340 that includes the data. The SCI-2 335 may include various types of information, such as a hybrid automatic repeat request (HARQ) process identifier, a new data indicator (NDI), a source identifier, and a destination identifier associated with the TB 340 carried on the PSSCH 320. In some aspects, the HARQ process identifier, NDI, source identifier, and destination identifier may be used to determine whether the TB 340 carried on the PSSCH 320 is a new transmission or a retransmission. Furthermore, in cases where the sidelink channels 310 are configured for unicast communication, the SCI-2 335 may include a channel state information (CSI) report trigger. Alternatively, in cases where the sidelink channels 310 are configured for groupcast communication (e.g., using a negative acknowledgement-only distance-based feedback), the SCI-2 335 may include a zone identifier that indicates a location of the transmitter and a maximum communication range for sending feedback on the PSFCH 325. In some aspects, a UE 305 may transmit both the SCI-1 330 and the SCI-2 335. In some aspects, a UE 305 may transmit only SCI-1 330, in which case one or more types of the information that would otherwise be transmitted in the SCI-2 335 may be transmitted in the SCI-1 330 instead.

The PSFCH 325 may be used to communicate sidelink feedback 345, such as HARQ feedback (e.g., acknowledgement or negative acknowledgement (ACK/NACK) information), transmit power control (TPC), and/or a scheduling request (SR).

In some aspects, the one or more sidelink channels 310 may use resource pools. For example, a scheduling assignment (e.g., included in SCI-1 330) may be transmitted in sub-channels using specific resource blocks (RBs) across time. In some aspects, data transmissions (e.g., on the PSSCH 320) associated with a scheduling assignment may occupy adjacent RBs in the same subframe as the scheduling assignment (e.g., using frequency division multiplexing). In some aspects, a scheduling assignment and associated data transmissions are not transmitted on adjacent RBs.

In some aspects, a UE 305 may operate using a transmission mode where resource selection and/or scheduling is performed by the UE 305 (e.g., rather than a base station 110). In some aspects, the UE 305 may perform resource selection and/or scheduling by sensing channel availability for transmissions. For example, the UE 305 may measure a received signal strength indicator (RSSI) parameter (e.g., a sidelink-RSSI (S-RSSI) parameter) associated with various sidelink channels, may measure a reference signal received power (RSRP) parameter (e.g., a PSSCH-RSRP parameter) associated with various sidelink channels, and/or may measure a reference signal received quality (RSRQ) parameter (e.g., a PSSCH-RSRQ parameter) associated with various sidelink channels, and may select a channel for transmission of a sidelink communication based at least in part on the measurement(s).

Additionally, or alternatively, the UE 305 may perform resource selection and/or scheduling using SCI-1 330 received in the PSCCH 315, which may indicate occupied resources and/or channel parameters. Additionally, or alternatively, the UE 305 may perform resource selection and/or scheduling by determining a channel busy rate (CBR) associated with various sidelink channels 310, which may be used for rate control (e.g., by indicating a maximum number of RBs that the UE 305 can use for a particular set of subframes).

In the transmission mode where resource selection and/or scheduling is performed by a UE 305, the UE 305 may generate sidelink grants, and may transmit the grants in SCI-1 330 and/or SCI-2 335. A sidelink grant may indicate, for example, one or more parameters (e.g., transmission parameters) to be used for an upcoming sidelink transmission, such as one or more RBs to be used for the upcoming sidelink transmission on the PSSCH 320 (e.g., for TBs 340), one or more subframes to be used for the upcoming sidelink transmission, and/or an MCS to be used for the upcoming sidelink transmission. In some aspects, a UE 305 may generate a sidelink grant that indicates one or more parameters for semi-persistent scheduling (SPS), such as a periodicity of a sidelink transmission. Additionally, or alternatively, the UE 305 may generate a sidelink grant for event-driven scheduling, such as for an on-demand sidelink message.

As indicated above, FIG. 3 is provided as an example. Other examples may differ from what is described with respect to FIG. 3.

Figure 4:
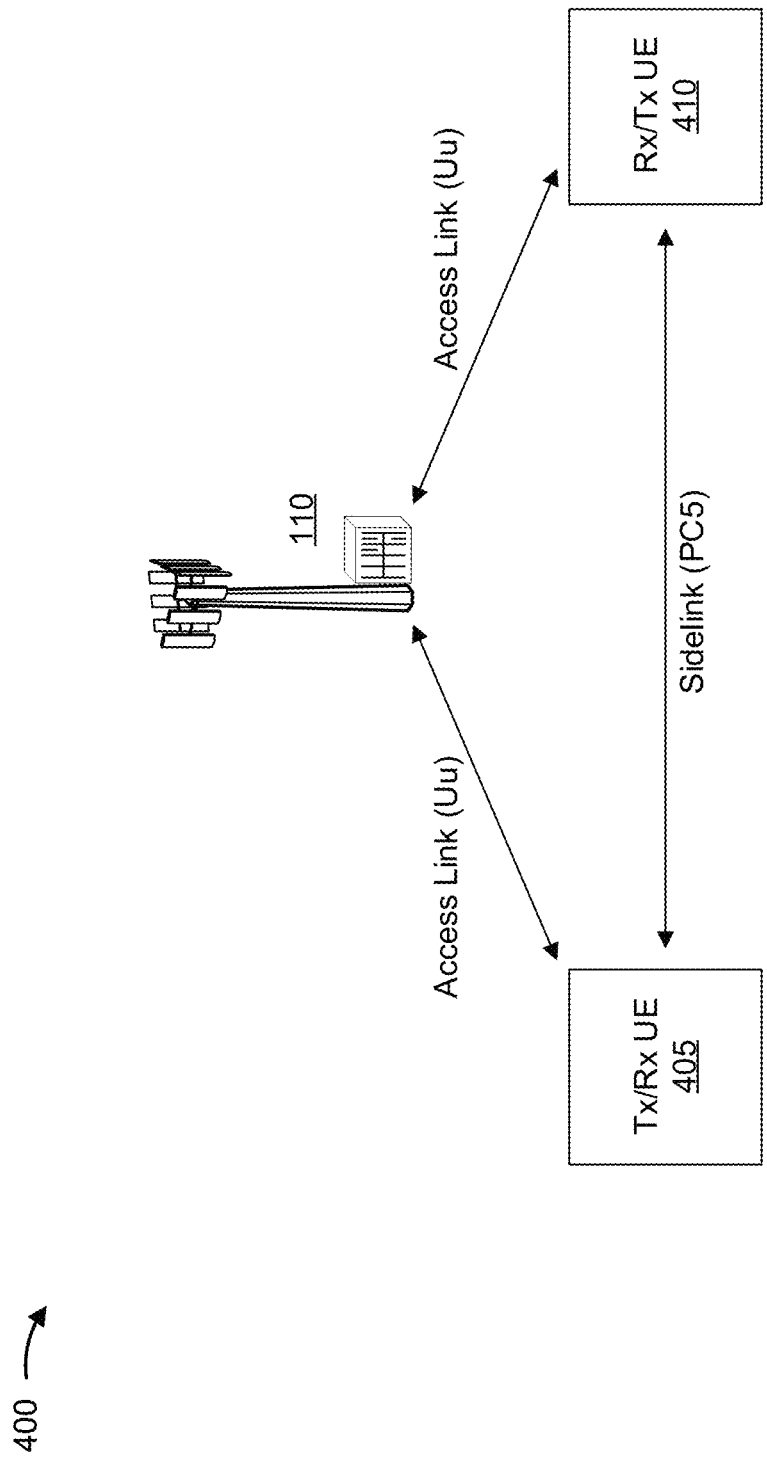
FIG. 4 is a diagram illustrating an example of sidelink communications and access link communications, in accordance with the present disclosure.

FIG. 4 is a diagram illustrating an example 400 of sidelink communications and access link communications, in accordance with the present disclosure.

As shown in FIG. 4, a transmitter (Tx)/receiver (Rx) UE 405 and an Rx/Tx UE 410 may communicate with one another via a sidelink, as described above in connection with FIG. 3. As further shown, in some sidelink modes, a base station 110 may communicate with the Tx/Rx UE 405 via a first access link. Additionally, or alternatively, in some sidelink modes, the base station 110 may communicate with the Rx/Tx UE 410 via a second access link. The Tx/Rx UE 405 and/or the Rx/Tx UE 410 may correspond to one or more UEs described elsewhere herein, such as the UE 120 of FIG. 1. Thus, a direct link between UEs 120 (e.g., via a PC5 interface) may be referred to as a sidelink, and a direct link between a base station 110 and a UE 120 (e.g., via a Uu interface) may be referred to as an access link. Sidelink communications may be transmitted via the sidelink, and access link communications may be transmitted via the access link. An access link communication may be either a downlink communication (from a base station 110 to a UE 120) or an uplink communication (from a UE 120 to a base station 110).

In some aspects, the Tx/Rx UE 405 and the Rx/Tx UE 410 may operate in a resource allocation mode in which the base station 110 reserves and allocates sidelink resources for the Tx/Rx UE 405 and the Rx/Tx UE 410. This may be referred to as Mode 1 sidelink resource allocation. In some aspects, the Tx/Rx UE 405 and the Rx/Tx UE 410 may operate in a resource allocation mode in which sidelink resource selection and/or scheduling is performed by the Tx/Rx UE 405 and/or the Rx/Tx UE 410 (e.g., rather than the base station 110). This may be referred to as Mode 2 sidelink resource allocation. In a Mode 2 sidelink resource allocation scheme, the base station 110 may transmit a sidelink grant to the Tx/Rx UE 405 and/or the Rx/Tx UE 410 via the access link. The sidelink grant may be a dynamic grant (e.g., received in a downlink control information (DCI) communication) or a semi-static/configured grant (e.g., received in a radio resource control (RRC) communication). For semi-static/configured grants, the base station 110 may activate a sidelink grant in the same RRC communication that configures the sidelink grant (referred to as a Type 1 configured grant) or may activate the sidelink grant in a DCI communication (referred to as a Type 2 configured grant). In some aspects, signaling on the sidelink (via the PC5 interface) may be the same in the Mode 1 and Mode 2 sidelink resource allocation schemes (e.g., there may be no observable difference between the two modes from the perspective of a receiving UE).

As indicated above, FIG. 4 is provided as an example. Other examples may differ from what is described with respect to FIG. 4.

Figure 5:
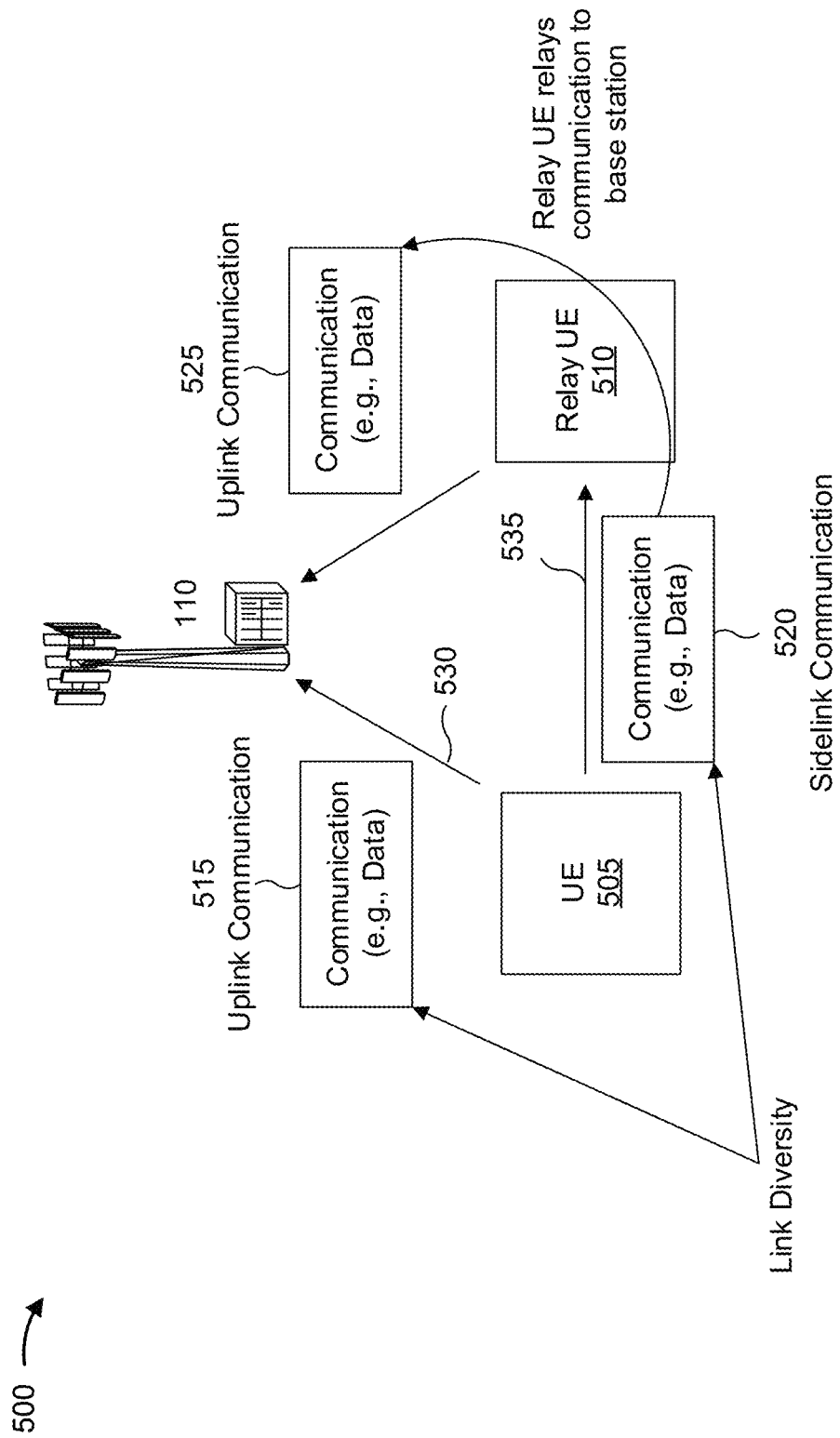
FIG. 5 is a diagram illustrating an example of a relay UE that relays communications between a UE and a base station, in accordance with the present disclosure.

FIG. 5 is a diagram illustrating an example 500 of a relay UE that relays communications between a UE and a base station, in accordance with the present disclosure. As shown, example 500 includes a UE 505, a relay UE 510, and a base station 110. In example 500, the UE 505 is a Tx UE, and the relay UE 510 is an Rx UE. In some aspects, the UE 505 is one UE 120, and the relay UE 510 is another UE 120. In some aspects, the UE 505 may be referred to as a source UE or a remote UE.

As shown in FIG. 5, the UE 505 may transmit a communication (e.g., data and/or control information) directly to the base station 110 on an access link (via a Uu interface) as an uplink communication 515. Additionally, or alternatively, the UE 505 may transmit a communication (e.g., data and/or control information) indirectly to the base station 110 via the relay UE 510. For example, the UE 505 may transmit the communication to the relay UE 510 on a sidelink (via a PC5 interface) as a sidelink communication 520, and the relay UE 510 may relay (e.g., forward or transmit) the communication to the base station 110 on the access link as an uplink communication 525.

In some aspects, the UE 505 may communicate directly with the base station 110 via a direct link 530. For example, the uplink communication 515 may be transmitted via the direct link 530. A communication transmitted via the direct link 530 between the UE 505 and the base station 110 (e.g., in the uplink communication 515) does not pass through and is not relayed by the relay UE 510. In some aspects, the UE 505 may communicate indirectly with the base station 110 via an indirect link 535. For example, the sidelink communication 520 and the uplink communication 525 may be transmitted via different segments of the indirect link 535. A communication transmitted via the indirect link 535 between the UE 505 and the base station 110 (e.g., in the sidelink communication 520 and the uplink communication 525) passes through and is relayed by the relay UE 510.

Using the communication scheme shown in FIG. 5 may improve network performance and increase reliability by providing the UE 505 with link diversity for communicating with the base station 110. For millimeter wave (e.g., frequency range 2, or FR2) communications, which are susceptible to link blockage and link impairment, this link diversity may improve reliability and prevent multiple retransmissions of data that may otherwise be retransmitted in order to achieve a successful communication. However, techniques described herein are not limited to millimeter wave communications, and may be used for sub-6 gigahertz (e.g., frequency range 1, or FR1) communications.

In some cases, the UE 505 may transmit a communication (e.g., the same communication) to the base station 110 via both the direct link 530 and the indirect link 535. In other cases, the UE 505 may select one of the links (e.g., either the direct link 530 or the indirect link 535), and may transmit a communication to the base station 110 using only the selected link. Alternatively, the UE 505 may receive an indication of one of the links (e.g., either the direct link 530 or the indirect link 535), and may transmit a communication to the base station 110 using only the indicated link. The indication may be transmitted by the base station 110 and/or the relay UE 510. In some aspects, such selection and/or indication may be based at least in part on channel conditions and/or link reliability.

As indicated above, FIG. 5 is provided as an example. Other examples may differ from what is described with respect to FIG. 5.

Figure 6:
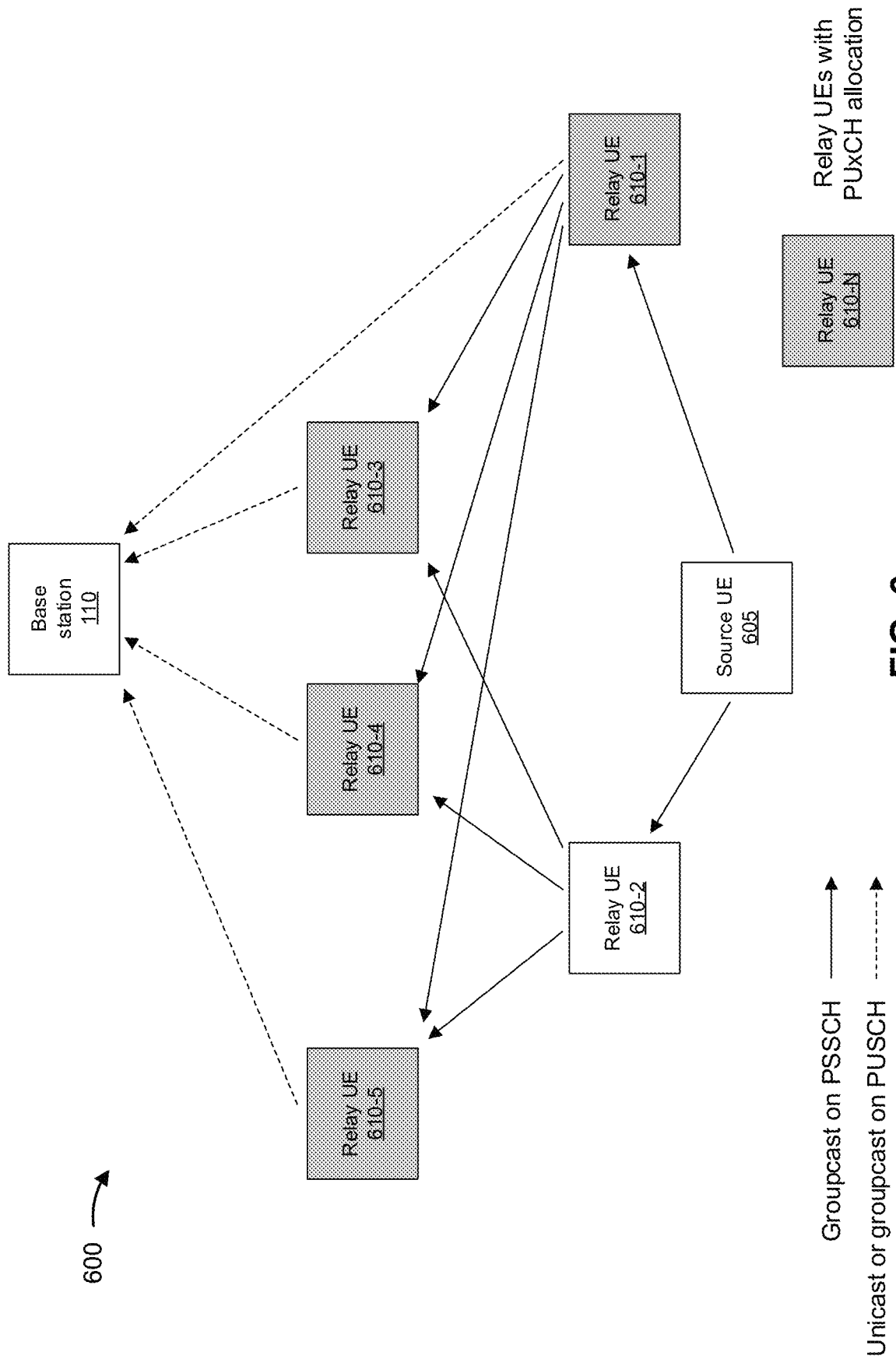
FIG. 6 is a diagram illustrating an example of uplink relaying from a source UE to a base station over sidelink and access link interfaces, in accordance with the present disclosure.

FIG. 6 is a diagram illustrating an example 600 of uplink relaying from a source UE to a base station over sidelink and access link interfaces, in accordance with the present disclosure. As shown, example 600 includes a source UE 610, a base station 110, and various relay UEs 610-1 through 610-5 that may communicate on a sidelink and/or an access link to relay an uplink transmission from the source UE 605 to the base station 110. For example, as shown in FIG. 6, the source UE may transmit a sidelink communication that includes a TB to be relayed to the base station to relay UE 610-1 and relay UE 610-2 via a sidelink (PC5) interface. For example, the sidelink communication may be transmitted as a groupcast communication on a PSSCH. As further shown, relay UE 610-1 and relay UE 610-2 may forward the TB to relay UEs 610-3, 610-4, 610-5 that are in a next hop towards the base station 110.

In some aspects, as shown, the base station 110 may assign an uplink resource allocation to UEs that are within communication range of the base station 110. For example, as shown, the base station 110 may provide a PUCCH and/or PUSCH resource allocation for uplink relaying to relay UEs 610-1, 610-3, 610-4, and 610-5 (e.g., via DCI). Accordingly, in addition to receiving a groupcast sidelink transmission that carries a TB to be forwarded to the base station 110 from a downstream UE via a sidelink (or PC5 interface), relay UEs 610-1, 610-3, 610-4, and 610-5 may each be configured to use the uplink resource allocation provided by the base station 110 to forward a TB carried in the groupcast sidelink transmission to the base station 110 via an access link (or Uu interface) as a unicast or groupcast transmission on a PUSCH. Furthermore, in some cases, one or more relay UEs with an uplink resource allocation may be able to overhear or otherwise detect the uplink transmission(s) by other relay UEs with an uplink resource allocation. For example, in FIG. 6, relay UE 610-5 may detect the uplink transmission by any one or more of relay UEs 610-1, 610-3, or 610-4.

Consequently, the relay UEs 610-1, 610-3, 610-4, and 610-5 that have an uplink resource allocation could potentially combine sidelink and access link transmissions and/or select between the sidelink and access link transmissions to improve decoding performance (e.g., increasing a probability that the uplink message ultimately relayed to the base station 110 passes a cyclic redundancy check (CRC)). However, in order to combine a sidelink transmission received from a downstream UE with an access link transmission by another relay UE and/or to select between a sidelink transmission received from a downstream UE with an access link transmission by another relay UE, a relay UE needs to have detailed information related to the transmission parameters for both the sidelink transmission and the access link transmission. While SCI may generally indicate the sidelink transmission parameters to a relay UE that receives a sidelink transmission, the base station may indicate different uplink resource allocations for different relay UEs. As a result, relay UEs may be unable to decode the access link transmissions by other relay UEs. Furthermore, in some cases, the sidelink and/or the access link may be configured with multiple component carriers, and a relay needs to know the transmission parameters across all links and all component carriers in order to coherently combine and/or select between different links and/or component carriers. In such cases, decoding performance for the relay UEs that have an uplink resource allocation may be constrained based on conditions on the sidelink, which may reduce reliability and/or communication range for uplink relaying operations (e.g., where the access link is associated with better channel conditions than the sidelink).

Some aspects described herein relate to techniques and apparatuses for link combining and component carrier selection across sidelink and access link interfaces. For example, in some aspects, a relay UE that has an uplink resource allocation may receive signaling that indicates various transmission parameters for one or more component carriers that are configured on a sidelink and one or more component carriers that are configured on an access link. Accordingly, when generating an uplink message that includes a TB to be relayed to a base station, the UE may select one or more component carriers associated with the sidelink, one or more component carriers associated with the access link, or one or more component carriers associated with the sidelink and one or more component carriers associated with the access link (e.g., in a sidelink and access link aggregation scenario). For example, based on the transmission parameters for the component carrier(s) configured on the sidelink and the component carrier(s) configured on the access link, a relay UE may detect a sidelink transmission and an access link transmission that carry the same TB. In such cases, the relay UE may select (e.g., autonomously, based on a report received from the base station, and/or based on information received from a dedicated monitoring UE) one or more component carriers associated with the sidelink, the access link, or both from which to obtain the data associated with the TB. Accordingly, the UE may transmit, to a base station, an uplink message that includes the data associated with the TB, which the UE obtains from a TB carried in a sidelink transmission, a TB carried in an access link transmission, or both. In this way, the relay UE may improve decoding performance for the TB by coherently combining data from sidelink and access link transmissions and/or selecting one link that offers the best performance.

As indicated above, FIG. 6 is provided as an example. Other examples may differ from what is described with respect to FIG. 6.

Figure 7:
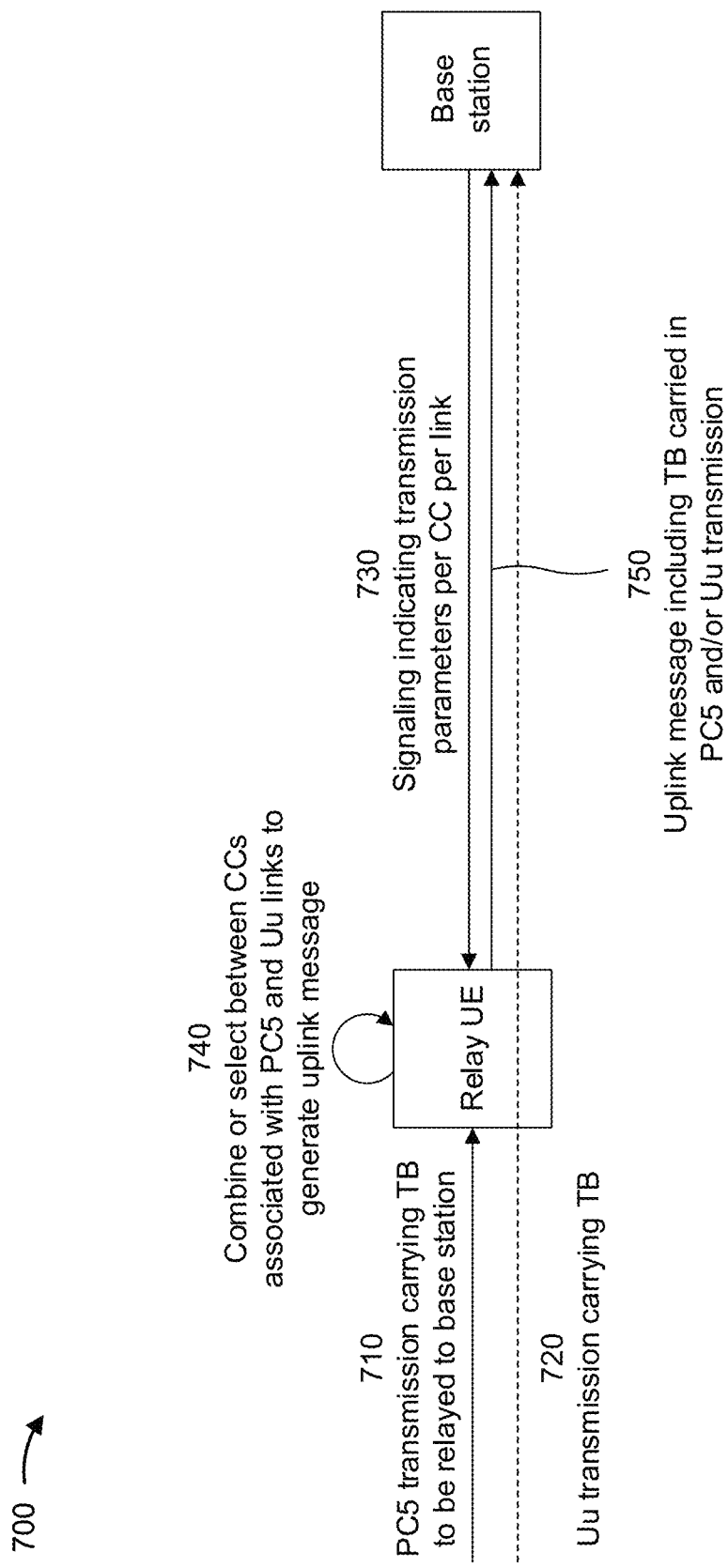
FIG. 7 is a diagram illustrating an example associated with link combining and component carrier selection across sidelink and access link interfaces, in accordance with the present disclosure.

FIG. 7 is a diagram illustrating an example associated with link combining and component carrier selection across sidelink and access link interfaces, in accordance with the present disclosure. As shown in FIG. 7, example 700 includes communication between a base station (e.g., base station 110) and a relay UE (e.g., UE 120, UE 305, Tx/Rx UE 405, Rx/Tx UE 410, relay UE 510, and/or relay UE(s) 610-N). In some aspects, the relay UE and the base station may be included in a wireless network, such as wireless network 100. The relay UE and the base station may communicate via a wireless access link that includes an uplink and a downlink, which may be referred to herein as a Uu interface or a Uu link. Furthermore, as described in further detail herein, the relay UE may communicate with one or more downstream UEs (e.g., a source UE and/or another relay UE) via a wireless sidelink, which may be referred to herein as a PC5 interface or a PC5 link, and the base station may communicate with the source UE and/or another relay UE via the wireless access link. Accordingly, in some cases, the relay UE may detect a PC5 transmission on the sidelink and a Uu transmission on the access link that are carrying the same TB. In such cases, as described herein, the relay UE may select and/or combine data associated with the TB across the PC5 and Uu interfaces when generating an uplink message to forward the TB to the base station.

For example, as shown in FIG. 7, and by reference number 710, the relay UE may receive and/or detect, via the sidelink, a sidelink (or PC5) transmission that carries a TB to be forwarded to the base station. Furthermore, as shown by reference number 720, the relay UE may detect (e.g., overhear), on the access link, an uplink (or Uu) transmission from another UE to the base station. Accordingly, in cases where the same TB is carried in the sidelink transmission and the uplink transmission, the relay UE may generate an uplink message that includes data associated with the TB, which the relay UE obtains from the sidelink transmission, the uplink transmission, or both. In some aspects, in order to combine the data associated with the TB from the sidelink transmission and the uplink transmission or select the data from either the sidelink transmission or the uplink transmission, the relay UE may generally need to have a capability to decode both the sidelink transmission and the uplink transmission. Accordingly, as described herein, various transmission parameters associated with the sidelink transmission and the uplink transmission may be signaled to the relay UE in order to enable data combining and/or selection across the sidelink and the access link.

For example, as further shown in FIG. 7, and by reference number 730, the relay UE may receive signaling that indicates a set of transmission parameters for one or more component carriers that are configured for the sidelink and one or more component carriers that are configured for the access link. In some aspects, the relay UE may receive the signaling that indicates the set of transmission parameters for the one or more component carriers that are configured for the access link from the base station. For example, in some aspects, the set of transmission parameters for the access link component carrier(s) may be provided in downlink control information (DCI) or other suitable signaling that indicates a PUCCH and/or PUSCH resource allocation assigned to another UE for relaying and/or transmitting to the base station. Furthermore, in some cases, the relay UE may receive the signaling that indicates the set of transmission parameters for the one or more component carriers that are configured for the sidelink from the base station (e.g., in a Mode 1 sidelink resource allocation) or from another UE (e.g., in a Mode 2 sidelink resource allocation). For example, the set of transmission parameters for the sidelink component carrier(s) may be provided in sidelink control information (SCI) (e.g., SCI-1 and/or SCI-2) that indicates the set of transmission parameters to enable a receiving UE to decode the sidelink transmission.

In some aspects, the set of transmission parameters for the sidelink component carrier(s) and the set of transmission parameters for the access link component carrier(s) may each include a frequency domain resource allocation (FDRA) and a time domain resource allocation (TDRA), which may be indicated to the relay UE to enable the UE to detect the sidelink and uplink transmissions in the frequency domain and the time domain. The FDRA and the TDRA may generally indicate one or more resource elements (REs) and/or resource blocks (RBs) in one or more symbols or slots that are carrying a TB destined for the base station. For example, the FDRA and the TDRA for the sidelink transmission may indicate, for each component carrier configured on the sidelink, one or more REs or RBs that are carrying a TB to be relayed to the base station. Similarly, the FDRA and the TDRA for the uplink transmission may indicate, for each component carrier configured on the access link, one or more REs or RBs carrying a TB transmitted to the base station by another UE. Accordingly, the relay UE may use the FDRA and the TDRA associated with the sidelink and uplink transmissions to detect the PSSCH and the PUSCH carrying data associated with the TB.

In some aspects, to enable combining and/or selecting across the sidelink and access link interfaces, the same TB has to be carried in the sidelink transmission and the uplink transmission. Accordingly, a HARQ identifier associated with the TB may be fixed across all possible links and component carriers from which the relay UE is able to obtain the TB. For example, in cases where there are X component carriers configured on the sidelink and Y component carriers configured on the access link, the HARQ identifier associated with the TB may be uniform across the X component carriers configured on the sidelink and the Y component carriers configured on the access link. In some aspects, the HARQ process identifier may be defined according to a source node or UE identifier and a common relaying identifier per TB (e.g., an identifier shared by each relay UE that participates in relaying a particular TB in one or more hops between the source node and the base station). Accordingly, in cases where the sidelink transmission and the uplink transmission detected by the relay UE are associated with the same HARQ identifier, the relay UE may determine that the data associated with the TB to be relayed to the base station may be obtained from the sidelink transmission and/or the uplink transmission.

Furthermore, in some aspects, the set of transmission parameters that are signaled to the relay UE may include a redundancy version (RV) index and an MCS associated with each component carrier configured on the sidelink, and an RV index and an MCS associated with each component carrier configured on the access link. For example, each UE that transmits a TB on the sidelink or the access link may store data associated with the TB in a circular buffer, and only part of the data can be sent at a certain time due to resource limitations. Accordingly, the RV index may have a value of 0, 1, 2, or 3, which may indicate a starting location and an ending location for the transmitted data within the circular buffer. For example, the data in the circular buffer may include one or more systematic bits (or information bits) and parity bits that are used for channel encoding to provide additional robustness for the transmitted bits and allow the receiver to decode the data even if there are some errors in the transmission. Accordingly, for each sidelink transmission and access link transmission carrying the same TB, the RV index for the corresponding transmission may be signaled to the relay UE to indicate the starting and ending location in the circular buffer for the corresponding transmission. In this way, indicating the RV index for each transmission may enable the relay UE to combine the data transmitted on different links and/or different component carriers (e.g., based on a log likelihood ratio (LLR) for the different transmissions). Furthermore, indicating the MCS for each transmission may enable the relay UE to determine a coding rate and a modulation order for each transmission such that the relay UE can decode the sidelink and uplink transmissions and combine and/or select the data transmitted on different links and/or different component carriers.

As further shown in FIG. 7, and by reference number 740, the relay UE may combine and/or select between the component carrier(s) associated with the sidelink and the component carrier(s) associated with the access link to generate an uplink message to be transmitted to the base station. For example, as described above, an FDRA, TDRA, RV index, and MCS may be signaled to the relay UE for each component carrier associated with the sidelink and each component carrier associated with the access link. Accordingly, in cases where the same TB is carried in a sidelink transmission on one or more sidelink component carriers and/or an uplink transmission on one or more access link component carriers (e.g., based on the sidelink and uplink transmissions having the same HARQ identifier), the relay UE may decode the TB from any one or more component carriers that are selected from the component carrier(s) associated with the sidelink and the component carrier(s) associated with the access link. For example, in cases where X component carriers on the sidelink and Y component carriers on the access link include transmissions that are carrying the same TB, the relay UE may obtain the data associated with the TB from K component carriers, where $1 \leq K \leq X+Y$. In some aspects, the K component carriers may be selected based on any suitable criteria, such as channel state information (CSI) associated with each component carrier and/or a capability of the relay UE to monitor each component carrier, among other examples. Furthermore, as described herein, the K component carriers may be selected autonomously by the relay UE, by the base station and signaled to the relay UE via the access link, or by a dedicated monitoring UE that signals the selected component carrier(s) to the relay UE via the sidelink.

For example, in some aspects, the base station may perform component carrier selection across the sidelink and access link interfaces, and may transmit a report to each relay UE that indicates one or more best component carriers per relay UE (e.g., based on measurements obtained by the base station and/or channel state feedback provided to the base station by the relay UE, the source UE, and/or one or more other relay UEs, among other examples). For example, the base station may perform the component carrier selection and signal the best component carrier(s) that the relay UE is to use to combine and/or select the data associated with the TB in a Mode 1 sidelink resource allocation. Additionally, or alternatively, in a Mode 2 sidelink resource allocation, where resource selection is performed autonomously by a UE, the base station may perform component carrier selection for the access link and a monitoring UE may perform the component carrier selection for the sidelink. In this case, the monitoring UE may be the source UE or a dedicated monitoring UE, which may correspond to the relay UE shown in FIG. 7 or a different UE. Additionally, or alternatively, the relay UE may select the best component carrier(s) across the sidelink and access link interfaces and transmit a report that indicates the best component carrier(s) to the base station or to the monitoring UE. In the latter case, where the relay UE signals the best component carrier(s) to the monitoring UE, the monitoring UE may signal the best component carrier(s) selected by the relay UE to the base station.

As further shown in FIG. 7, and by reference number 750, the relay UE may transmit, to the base station, an uplink message that includes the TB carried in the sidelink transmission and/or the access link transmission. For example, as described above, the relay UE may select one or more component carriers across the sidelink and access link interfaces based on CSI, a monitoring capability, and/or other criteria associated with the sidelink component carrier(s) and the access link component carrier(s). Furthermore, in some aspects, the base station may select the one or more component carriers across the sidelink and access link interfaces and signal the selected component carrier(s) to the relay UE (e.g., in a Mode 1 sidelink resource allocation), or the base station may select one or more component carriers for the access link interface only (e.g., in a Mode 2 sidelink resource allocation). In the latter case, in a Mode 2 sidelink resource allocation, the relay UE or another UE may select the one or more component carriers for the sidelink interface, and the selected component carrier(s) may be indicated to the base station. Accordingly, as described herein, the relay UE may obtain the data associated with the TB that is included in the uplink message transmitted to the base station from a sidelink transmission on one or more sidelink component carriers, an uplink transmission on one or more access link component carriers, or both.

In some aspects, prior to transmitting the uplink message, the relay UE may perform an integrity check to validate that the TB carried therein was properly decoded and/or generated. For example, in cases where the relay UE combines the data associated with the TB from different transmissions (e.g., on different sidelink component carriers and/or access link component carriers), the relay UE may perform a cyclic redundancy check (CRC) for the TB included in the sidelink transmission(s) and/or the uplink transmission(s). In such cases, the relay UE may determine that the uplink message transmitted to the base station has passed the CRC if the CRC passes for any of the received TBs associated with the same HARQ identifier. Furthermore, in some aspects, the relay UE may announce the component carrier(s) that were selected to generate the uplink message via the sidelink and/or the access link such that other UEs and/or the base station can properly adjust a receiver to process the TB carried in the uplink transmission (e.g., to enable the TB to be decoded at a next hop).

For example, the relay UE may announce the component carrier(s) that were selected and/or combined to generate the TB included in the uplink message via the access link to enable the base station to decode the uplink message. Alternatively, in cases where the relay UE does not signal the selected component carrier(s) and/or the base station otherwise does not receive signaling that indicates the selected component carrier(s), the base station may monitor each component carrier or a subset of the component carriers configured for the access link and attempt to decode the TB carried on the monitored component carriers (e.g., if the base station transmits a report to the relay UE that indicates two or more best component carriers for the access link and does not receive signaling to announce the component carrier(s) selected by the relay UE, the base station may monitor only the two or more best component carriers indicated in the report transmitted to the relay UE). Additionally, or alternatively, the relay UE may announce the component carrier(s) that were selected and/or combined to generate the TB included in the uplink message via the sidelink, such that other relay UEs with an uplink resource allocation and a capability to overhear the uplink transmission by the relay UE can decode the uplink message (e.g., when generating an uplink message to relay the same TB to the base station).

As indicated above, FIG. 7 is provided as an example. Other examples may differ from what is described with respect to FIG. 7.

Figure 8:
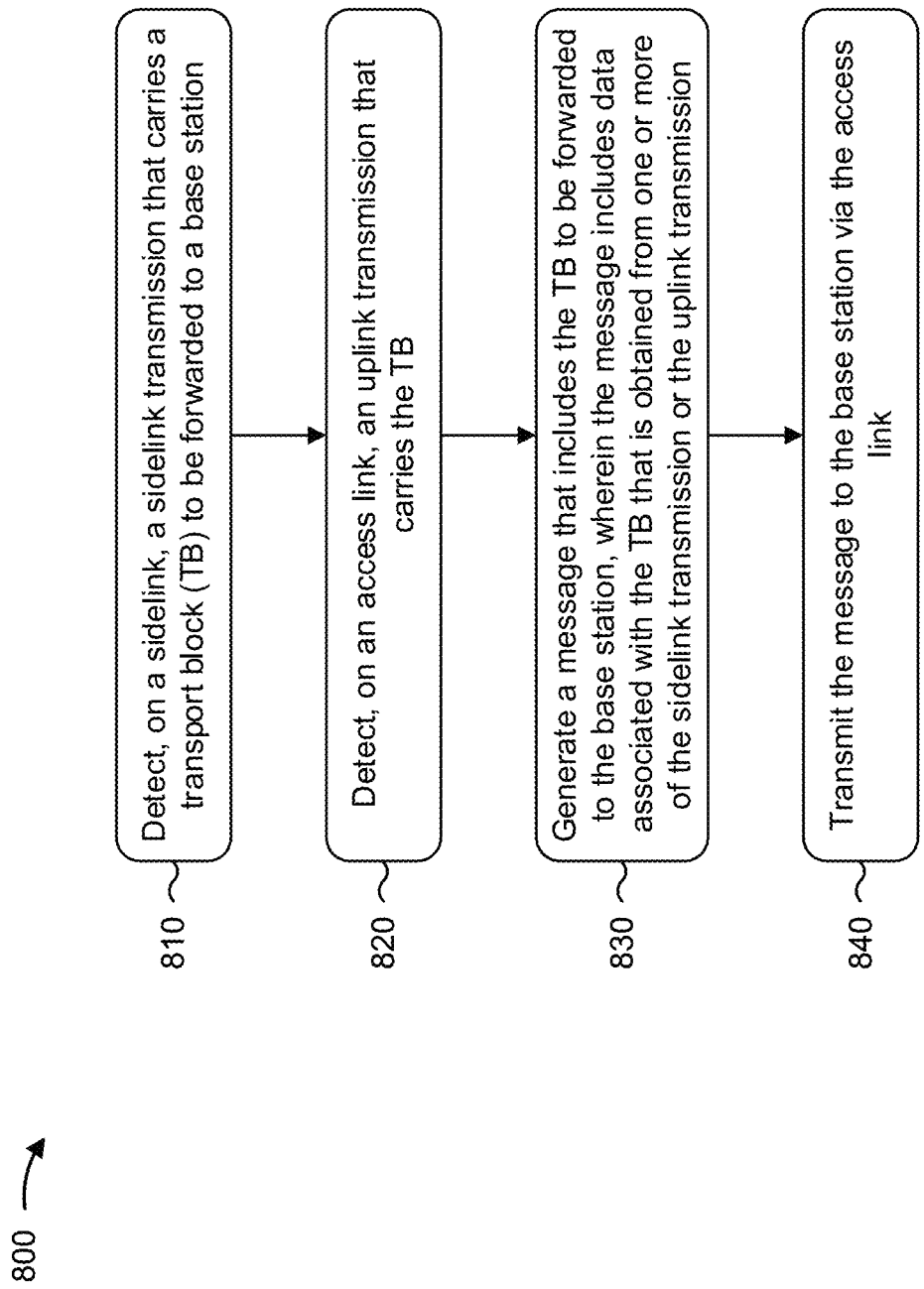
FIG. 8 is a diagram illustrating an example process associated with link combining and component carrier selection across sidelink and access link interfaces, in accordance with the present disclosure.

FIG. 8 is a diagram illustrating an example process 800 performed, for example, by a relay UE, in accordance with the present disclosure. Example process 800 is an example where the relay UE (e.g., UE 120, UE 305, Tx/Rx UE 405, Rx/Tx UE 410, relay UE 510, and/or relay UE(s) 610-N) performs operations associated with link combining and component carrier selection across sidelink and access link interfaces.

As shown in FIG. 8, in some aspects, process 800 may include detecting, on a sidelink, a sidelink transmission that carries a TB to be forwarded to a base station (block 810). For example, the relay UE (e.g., using detection component 908, depicted in FIG. 9) may detect, on a sidelink, a sidelink transmission that carries a TB to be forwarded to a base station, as described above.

As further shown in FIG. 8, in some aspects, process 800 may include detecting, on an access link, an uplink transmission that carries the TB (block 820). For example, the relay UE (e.g., using detection component 908, depicted in FIG. 9) may detect, on an access link, an uplink transmission that carries the TB, as described above.

As further shown in FIG. 8, in some aspects, process 800 may include generating a message that includes the TB to be forwarded to the base station, wherein the message includes data associated with the TB that is obtained from one or more of the sidelink transmission or the uplink transmission (block 830). For example, the relay UE (e.g., using message generation component 910, depicted in FIG. 9) may generate a message that includes the TB to be forwarded to the base station, wherein the message includes data associated with the TB that is obtained from one or more of the sidelink transmission or the uplink transmission, as described above.

As further shown in FIG. 8, in some aspects, process 800 may include transmitting the message to the base station via the access link (block 840). For example, the relay UE (e.g., using transmission component 904, depicted in FIG. 9) may transmit the message to the base station via the access link, as described above.

Process 800 may include additional aspects, such as any single aspect or any combination of aspects described below and/or in connection with one or more other processes described elsewhere herein.

In a first aspect, generating the message includes obtaining data associated with the TB from the sidelink transmission based at least in part on a set of parameters associated with the sidelink transmission, obtaining data associated with the TB from the uplink transmission based at least in part on a set of parameters associated with the uplink transmission, and combining the data obtained from the sidelink transmission and the data obtained from the uplink transmission to generate the message.

In a second aspect, alone or in combination with the first aspect, the set of parameters associated with the sidelink transmission and the set of parameters associated with the uplink transmission each include an FDRA and a TDRA for the respective transmission.

In a third aspect, alone or in combination with one or more of the first and second aspects, a HARQ identifier associated with the TB is included in the set of parameters associated with the sidelink transmission and the set of parameters associated with the uplink transmission.

In a fourth aspect, alone or in combination with one or more of the first through third aspects, the set of parameters associated with the sidelink transmission and the set of parameters associated with the uplink transmission each include an RV index and an MCS for the respective transmission.

In a fifth aspect, alone or in combination with one or more of the first through fourth aspects, generating the message further includes performing a CRC for the TB included in the sidelink transmission and the TB included in the uplink transmission, and determining that the message that includes the TB to be forwarded to the base station has passed the CRC based at least in part on the TB included in the sidelink transmission or the TB included in the uplink transmission passing the CRC.

In a sixth aspect, alone or in combination with one or more of the first through fifth aspects, generating the message includes identifying a first set of component carriers associated with the sidelink and a second set of component carriers associated with the access link, and selecting, from the first set of component carriers and the second set of component carriers, one or more component carriers from which to obtain the data associated with the TB to be forwarded to the base station.

In a seventh aspect, alone or in combination with one or more of the first through sixth aspects, the one or more component carriers are selected based at least in part on CSI associated with the first set of component carriers and the second set of component carriers or a capability to monitor the first set of component carriers and the second set of component carriers.

In an eighth aspect, alone or in combination with one or more of the first through seventh aspects, process 800 includes receiving signaling that indicates transmission parameters associated with the sidelink transmission per component carrier associated with the sidelink, and receiving signaling that indicates transmission parameters associated with the uplink transmission per component carrier associated with the access link.

In a ninth aspect, alone or in combination with one or more of the first through eighth aspects, process 800 includes receiving, from the base station, a report that indicates one or more best component carriers for the relay UE, wherein the one or more component carriers are selected based at least in part on the one or more best component carriers.

In a tenth aspect, alone or in combination with one or more of the first through ninth aspects, process 800 includes announcing, via one or more of the sidelink or the access link, the one or more component carriers used to obtain the data associated with the TB.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

Figure 9:
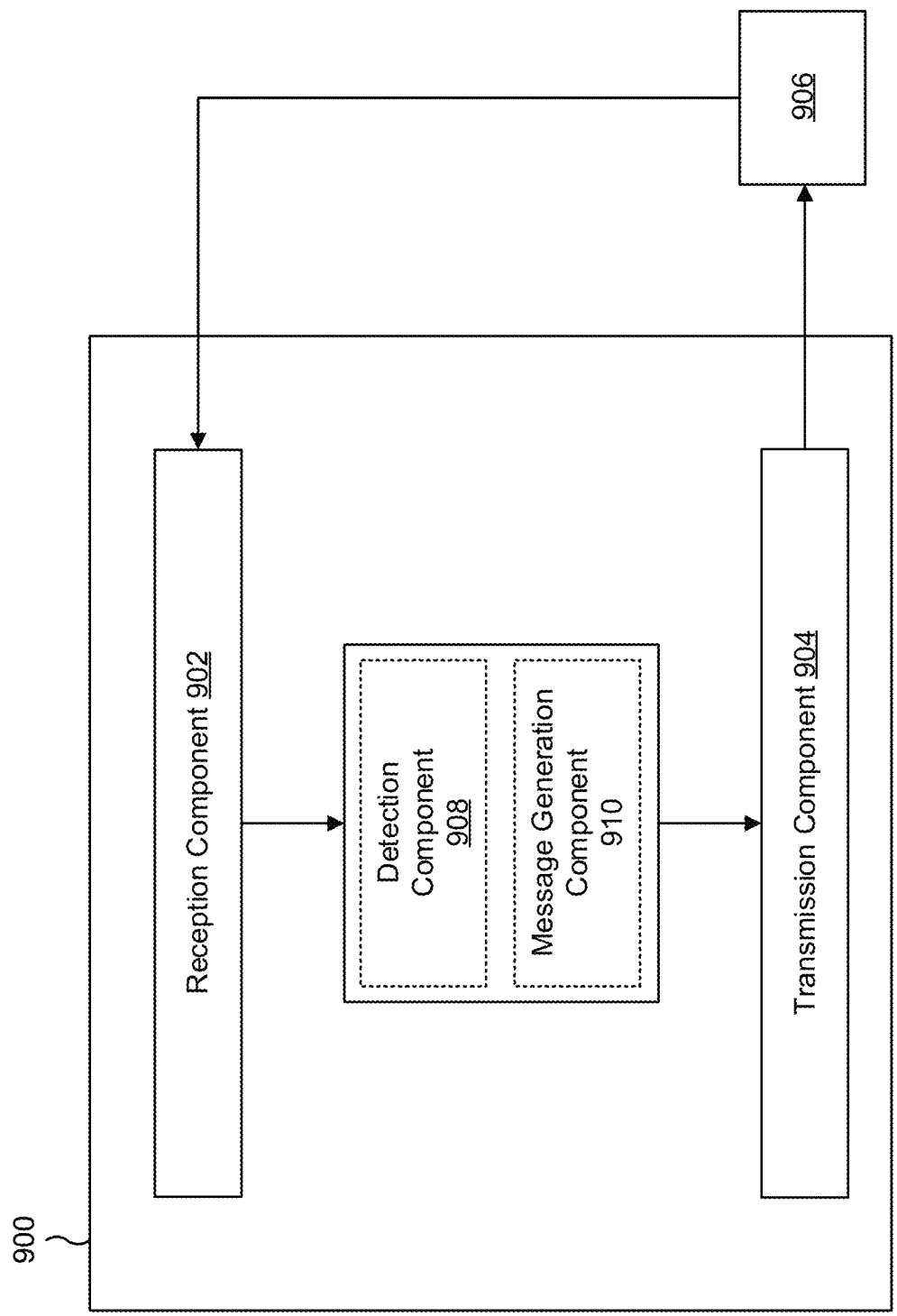
FIG. 9 is a block diagram of an example apparatus for wireless communication, in accordance with the present disclosure.

FIG. 9 is a block diagram of an example apparatus 900 for wireless communication. The apparatus 900 may be a UE, or a UE may include the apparatus 900. In some aspects, the apparatus 900 includes a reception component 902 and a transmission component 904, which may be in communication with one another (for example, via one or more buses and/or one or more other components). As shown, the apparatus 900 may communicate with another apparatus 906 (such as a UE, a base station, or another wireless communication device) using the reception component 902 and the transmission component 904. As further shown, the apparatus 900 may include one or more of a detection component 908 or a message generation component 910, among other examples.

In some aspects, the apparatus 900 may be configured to perform one or more operations described herein in connection with FIG. 7. Additionally, or alternatively, the apparatus 900 may be configured to perform one or more processes described herein, such as process 800 of FIG. 8. In some aspects, the apparatus 900 and/or one or more components shown in FIG. 9 may include one or more components of the UE described above in connection with FIG. 2. Additionally, or alternatively, one or more components shown in FIG. 9 may be implemented within one or more components described above in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 902 may receive communications, such as reference signals, control information, data communications, or a combination thereof, from the apparatus 906. The reception component 902 may provide received communications to one or more other components of the apparatus 900. In some aspects, the reception component 902 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 906. In some aspects, the reception component 902 may include one or more antennas, a demodulator, a MIMO detector, a receive processor, a controller/processor, a memory, or a combination thereof, of the UE described above in connection with FIG. 2.

The transmission component 904 may transmit communications, such as reference signals, control information, data communications, or a combination thereof, to the apparatus 906. In some aspects, one or more other components of the apparatus 906 may generate communications and may provide the generated communications to the transmission component 904 for transmission to the apparatus 906. In some aspects, the transmission component 904 may perform signal processing on the generated communications (such as filtering, amplification, modulation, digital-to-analog conversion, multiplexing, interleaving, mapping, or encoding, among other examples), and may transmit the processed signals to the apparatus 906. In some aspects, the transmission component 904 may include one or more antennas, a modulator, a transmit MIMO processor, a transmit processor, a controller/processor, a memory, or a combination thereof, of the UE described above in connection with FIG. 2. In some aspects, the transmission component 904 may be co-located with the reception component 902 in a transceiver.

The detection component 908 may detect, on a sidelink, a sidelink transmission that carries a TB to be forwarded to a base station. The detection component 908 may detect, on an access link, an uplink transmission that carries the TB. The message generation component 910 may generate a message that includes the TB to be forwarded to the base station, wherein the message includes data associated with the TB that is obtained from one or more of the sidelink transmission or the uplink transmission. The transmission component 904 may transmit the message to the base station via the access link.

The message generation component 910 may obtain data associated with the TB from the sidelink transmission based at least in part on a set of parameters associated with the sidelink transmission. The message generation component 910 may obtain data associated with the TB from the access link transmission based at least in part on a set of parameters associated with the access link transmission. The message generation component 910 may combine the data obtained from the sidelink transmission and the data obtained from the access link transmission to generate the message.

The message generation component 910 may perform a CRC for the TB included in the sidelink transmission and the TB included in the access link transmission. The message generation component 910 may determine that the message that includes the TB to be forwarded to the base station has passed the CRC based at least in part on the TB included in the sidelink transmission or the TB included in the access link transmission passing the CRC.

The message generation component 910 may identify a first set of component carriers associated with the sidelink and a second set of component carriers associated with the access link. The message generation component 910 may select, from the first set of component carriers and the second set of component carriers, one or more component carriers from which to obtain the data associated with the TB to be forwarded to the base station.

The reception component 902 may receive signaling that indicates transmission parameters associated with the sidelink transmission per component carrier associated with the sidelink. The reception component 902 may receive signaling that indicates transmission parameters associated with the uplink transmission per component carrier associated with the access link.

The reception component 902 may receive, from the base station, a report that indicates one or more best component carriers for the relay UE, wherein the one or more component carriers are selected based at least in part on the one or more best component carriers.

The transmission component 904 may announce, via one or more of the sidelink or the access link, the one or more component carriers used to obtain the data associated with the TB.

The number and arrangement of components shown in FIG. 9 are provided as an example. In practice, there may be additional components, fewer components, different components, or differently arranged components than those shown in FIG. 9. Furthermore, two or more components shown in FIG. 9 may be implemented within a single component, or a single component shown in FIG. 9 may be implemented as multiple, distributed components. Additionally, or alternatively, a set of (one or more) components shown in FIG. 9 may perform one or more functions described as being performed by another set of components shown in FIG. 9.

The following provides an overview of some Aspects of the present disclosure:

Aspect 1: A method of wireless communication performed by a relay UE, comprising: detecting, on a sidelink, a sidelink transmission that carries a TB to be forwarded to a base station; detecting, on an access link, an uplink transmission that carries the TB; generating a message that includes the TB to be forwarded to the base station, wherein the message includes data associated with the TB that is obtained from one or more of the sidelink transmission or the uplink transmission; and transmitting the message to the base station via the access link.

Aspect 2: The method of Aspect 1, wherein generating the message includes: obtaining data associated with the TB from the sidelink transmission based at least in part on a set of parameters associated with the sidelink transmission; obtaining data associated with the TB from the uplink transmission based at least in part on a set of parameters associated with the uplink transmission; and combining the data obtained from the sidelink transmission and the data obtained from the uplink transmission to generate the message.

Aspect 3: The method of Aspect 2, wherein the set of parameters associated with the sidelink transmission and the set of parameters associated with the uplink transmission each include an FDRA and a TDRA for the respective transmission.

Aspect 4: The method of any of Aspects 2-3, wherein a HARQ identifier associated with the TB is included in the set of parameters associated with the sidelink transmission and the set of parameters associated with the uplink transmission.

Aspect 5: The method of any of Aspects 2-4, wherein the set of parameters associated with the sidelink transmission and the set of parameters associated with the uplink transmission each include an RV index and an MCS for the respective transmission.

Aspect 6: The method of any of Aspects 1-5, wherein generating the message further includes: performing a cyclic redundancy check (CRC) for the TB included in the sidelink transmission and the TB included in the uplink transmission; and determining that the message that includes the TB to be forwarded to the base station has passed the CRC based at least in part on the TB included in the sidelink transmission or the TB included in the uplink transmission passing the CRC.

Aspect 7: The method of any of Aspects 1-6, wherein generating the message includes: identifying a first set of component carriers associated with the sidelink and a second set of component carriers associated with the access link; and selecting, from the first set of component carriers and the second set of component carriers, one or more component carriers from which to obtain the data associated with the TB to be forwarded to the base station.

Aspect 8: The method of Aspect 7, wherein the one or more component carriers are selected based at least in part on CSI associated with the first set of component carriers and the second set of component carriers or a capability to monitor the first set of component carriers and the second set of component carriers.

Aspect 9: The method of any of Aspects 1-8, further comprising: receiving signaling that indicates transmission parameters associated with the sidelink transmission per component carrier associated with the sidelink; and receiving signaling that indicates transmission parameters associated with the uplink transmission per component carrier associated with the access link.

Aspect 10: The method of any of Aspects 7-9, further comprising: receiving, from the base station, a report that indicates one or more best component carriers for the relay UE, wherein the one or more component carriers are selected based at least in part on the one or more best component carriers.

Aspect 11: The method of any of Aspects 7-10, further comprising: announcing, via one or more of the sidelink or the access link, the one or more component carriers used to obtain the data associated with the TB.

Aspect 12: An apparatus for wireless communication at a device, comprising a processor; memory coupled with the processor; and instructions stored in the memory and executable by the processor to cause the apparatus to perform the method of any of Aspects 1-11.

Aspect 13: A device for wireless communication, comprising a memory and one or more processors coupled to the memory, the memory and the one or more processors configured to perform the method of one or more Aspects of Aspects 1-11.

Aspect 14: An apparatus for wireless communication, comprising at least one means for performing the method of any of Aspects 1-11.

Aspect 15: A non-transitory computer-readable medium storing code for wireless communication, the code comprising instructions executable by a processor to perform the method of any of Aspects 1-11.

Aspect 16: A non-transitory computer-readable medium storing a set of instructions for wireless communication, the set of instructions comprising one or more instructions that, when executed by one or more processors of a device, cause the device to perform the method of any of Aspects 1-11.

The foregoing disclosure provides illustration and description, but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a processor is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method of wireless communication performed by a relay user equipment (UE), comprising:
    detecting, on a sidelink, a sidelink transmission that carries a transport block (TB) to be forwarded to a base station;
    detecting, on an access link, an uplink transmission that carries the TB;
    generating a message that includes the TB to be forwarded to the base station, wherein the message includes data associated with the TB that is obtained from one or more of the sidelink transmission or the uplink transmission; and
    transmitting the message to the base station via the access link.

2. The method of claim 1, wherein generating the message includes:
    obtaining data associated with the TB from the sidelink transmission based at least in part on a set of parameters associated with the sidelink transmission;
    obtaining data associated with the TB from the uplink transmission based at least in part on a set of parameters associated with the uplink transmission; and
    combining the data obtained from the sidelink transmission and the data obtained from the uplink transmission to generate the message.

3. The method of claim 2, wherein the set of parameters associated with the sidelink transmission and the set of parameters associated with the uplink transmission each include a frequency domain resource allocation and a time domain resource allocation for the respective transmission.

4. The method of claim 2, wherein a hybrid automatic repeat request identifier associated with the TB is included in the set of parameters associated with the sidelink transmission and the set of parameters associated with the uplink transmission.

5. The method of claim 2, wherein the set of parameters associated with the sidelink transmission and the set of parameters associated with the uplink transmission each include a redundancy version index and a modulation and coding scheme for the respective transmission.

6. The method of claim 2, wherein generating the message further includes:
    performing a cyclic redundancy check (CRC) for the TB included in the sidelink transmission and the TB included in the uplink transmission; and
    determining that the message that includes the TB to be forwarded to the base station has passed the CRC based at least in part on the TB included in the sidelink transmission or the TB included in the uplink transmission passing the CRC.

7. The method of claim 1, wherein generating the message includes:
    identifying a first set of component carriers associated with the sidelink and a second set of component carriers associated with the access link; and
    selecting, from the first set of component carriers and the second set of component carriers, one or more component carriers from which to obtain the data associated with the TB to be forwarded to the base station.

8. The method of claim 7, wherein the one or more component carriers are selected based at least in part on channel state information associated with the first set of component carriers and the second set of component carriers or a capability to monitor the first set of component carriers and the second set of component carriers.

9. The method of claim 7, further comprising:
    receiving signaling that indicates transmission parameters associated with the sidelink transmission per component carrier associated with the sidelink; and
    receiving signaling that indicates transmission parameters associated with the uplink transmission per component carrier associated with the access link.

10. The method of claim 7, further comprising:
    receiving, from the base station, a report that indicates one or more best component carriers for the relay UE, wherein the one or more component carriers are selected based at least in part on the one or more best component carriers.

11. The method of claim 7, further comprising:
announcing, via one or more of the sidelink or the access link, the one or more component carriers used to obtain the data associated with the TB.

12. A relay user equipment (UE) for wireless communication, comprising:
a memory; and
one or more processors operatively coupled to the memory, the memory and the one or more processors configured to:
detect, on a sidelink, a sidelink transmission that carries a transport block (TB) to be forwarded to a base station;
detect, on an access link, an uplink transmission that carries the TB;
generate a message that includes the TB to be forwarded to the base station, wherein the message includes data associated with the TB that is obtained from one or more of the sidelink transmission or the uplink transmission; and
transmit the message to the base station via the access link.

13. The relay UE of claim 12, wherein the one or more processors, when generating the message, are configured to:
obtain data associated with the TB from the sidelink transmission based at least in part on a set of parameters associated with the sidelink transmission;
obtain data associated with the TB from the uplink transmission based at least in part on a set of parameters associated with the uplink transmission; and
combine the data obtained from the sidelink transmission and the data obtained from the uplink transmission to generate the message.

14. The relay UE of claim 13, wherein the set of parameters associated with the sidelink transmission and the set of parameters associated with the uplink transmission each include a frequency domain resource allocation and a time domain resource allocation for the respective transmission.

15. The relay UE of claim 13, wherein a hybrid automatic repeat request identifier associated with the TB is included in the set of parameters associated with the sidelink transmission and the set of parameters associated with the uplink transmission.

16. The relay UE of claim 13, wherein the set of parameters associated with the sidelink transmission and the set of parameters associated with the uplink transmission each include a redundancy version index and a modulation and coding scheme for the respective transmission.

17. The relay UE of claim 13, wherein the one or more processors, when generating the message, are configured to:
perform a cyclic redundancy check (CRC) for the TB included in the sidelink transmission and the TB included in the uplink transmission; and
determine that the message that includes the TB to be forwarded to the base station has passed the CRC based at least in part on the TB included in the sidelink transmission or the TB included in the uplink transmission passing the CRC.

18. The relay UE of claim 12, wherein the one or more processors, when generating the message, are configured to:
identify a first set of component carriers associated with the sidelink and a second set of component carriers associated with the access link; and
select, from the first set of component carriers and the second set of component carriers, one or more component carriers from which to obtain the data associated with the TB to be forwarded to the base station.

19. The relay UE of claim 18, wherein the one or more component carriers are selected based at least in part on channel state information associated with the first set of component carriers and the second set of component carriers or a capability to monitor the first set of component carriers and the second set of component carriers.

20. The relay UE of claim 18, wherein the one or more processors are further configured to:
receive signaling that indicates transmission parameters associated with the sidelink transmission per component carrier associated with the sidelink; and
receive signaling that indicates transmission parameters associated with the uplink transmission per component carrier associated with the access link.

21. The relay UE of claim 18, wherein the one or more processors are further configured to:
receive, from the base station, a report that indicates one or more best component carriers for the relay UE, wherein the one or more component carriers are selected based at least in part on the one or more best component carriers.

22. The relay UE of claim 18, wherein the one or more processors are further configured to:
announce, via one or more of the sidelink or the access link, the one or more component carriers used to obtain the data associated with the TB.

23. A non-transitory computer-readable medium storing a set of instructions for wireless communication, the set of instructions comprising:
one or more instructions that, when executed by one or more processors of a relay user equipment (UE), cause the relay UE to:
detect, on a sidelink, a sidelink transmission that carries a transport block (TB) to be forwarded to a base station;
detect, on an access link, an uplink transmission that carries the TB;
generate a message that includes the TB to be forwarded to the base station, wherein the message includes data associated with the TB that is obtained from one or more of the sidelink transmission or the uplink transmission; and
transmit the message to the base station via the access link.

24. The non-transitory computer-readable medium of claim 23, wherein the one or more instructions, that cause the relay UE to generate the message, cause the relay UE to:
obtain data associated with the TB from the sidelink transmission based at least in part on a set of parameters associated with the sidelink transmission;
obtain data associated with the TB from the uplink transmission based at least in part on a set of parameters associated with the uplink transmission; and
combine the data obtained from the sidelink transmission and the data obtained from the uplink transmission to generate the message.

25. The non-transitory computer-readable medium of claim 23, wherein the one or more instructions, that cause the relay UE to generate the message, cause the relay UE to:
identify a first set of component carriers associated with the sidelink and a second set of component carriers associated with the access link; and
select, from the first set of component carriers and the second set of component carriers, one or more component carriers from which to obtain the data associated with the TB to be forwarded to the base station.

26. The non-transitory computer-readable medium of claim 25, wherein the one or more instructions further cause the relay UE to:
- receive signaling that indicates transmission parameters associated with the sidelink transmission per component carrier associated with the sidelink; and
- receive signaling that indicates transmission parameters associated with the uplink transmission per component carrier associated with the access link.

27. An apparatus for wireless communication, comprising:
- means for detecting, on a sidelink, a sidelink transmission that carries a transport block (TB) to be forwarded to a base station;
- means for detecting, on an access link, an uplink transmission that carries the TB;
- means for generating a message that includes the TB to be forwarded to the base station, wherein the message includes data associated with the TB that is obtained from one or more of the sidelink transmission or the uplink transmission; and
- means for transmitting the message to the base station via the access link.

28. The apparatus of claim 27, wherein the means for generating the message includes:
- means for obtaining data associated with the TB from the sidelink transmission based at least in part on a set of parameters associated with the sidelink transmission;
- means for obtaining data associated with the TB from the uplink transmission based at least in part on a set of parameters associated with the uplink transmission; and
- means for combining the data obtained from the sidelink transmission and the data obtained from the uplink transmission to generate the message.

29. The apparatus of claim 27, wherein the means for generating the message includes:
- means for identifying a first set of component carriers associated with the sidelink and a second set of component carriers associated with the access link; and
- means for selecting, from the first set of component carriers and the second set of component carriers, one or more component carriers from which to obtain the data associated with the TB to be forwarded to the base station.

30. The apparatus of claim 29, further comprising:
- means for receiving signaling that indicates transmission parameters associated with the sidelink transmission per component carrier associated with the sidelink; and
- means for receiving signaling that indicates transmission parameters associated with the uplink transmission per component carrier associated with the access link.

* * * * *